(12) United States Patent
Choi et al.

(10) Patent No.: US 10,170,462 B2
(45) Date of Patent: *Jan. 1, 2019

(54) DISPLAY DEVICE

(71) Applicant: LG DISPLAY CO., LTD., Seoul (KR)

(72) Inventors: Jaewoong Choi, Anyang-si (KR); SungLim Nam, Paju-si (KR); SeoungUk Heo, Paju-si (KR); WonJun Choi, Paju-si (KR); Misun Park, Gwangmyeong-si (KR); Younghyun Kong, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/913,478

(22) Filed: Mar. 6, 2018

(65) Prior Publication Data

US 2018/0197849 A1 Jul. 12, 2018

Related U.S. Application Data

(63) Continuation of application No. 15/200,787, filed on Jul. 1, 2016, now Pat. No. 9,947,652.

(30) Foreign Application Priority Data

Jul. 3, 2015 (KR) .................. 10-2015-0095395

(51) Int. Cl.
*G02F 1/1345* (2006.01)
*H01L 27/02* (2006.01)
(Continued)

(52) U.S. Cl.
CPC ........ *H01L 27/0292* (2013.01); *G02F 1/1368* (2013.01); *G02F 1/13452* (2013.01);
(Continued)

(58) Field of Classification Search
CPC ............... H01L 27/124; H01L 27/3276; H01L 51/5237; H01L 51/5203; G02F 1/1368;
(Continued)

(56) References Cited

U.S. PATENT DOCUMENTS

| 9,921,708 | B2* | 3/2018 | Kwak | ...................... G06F 3/047 |
| 2006/0028606 | A1* | 2/2006 | Takeguchi | .......... G02F 1/13454 349/149 |
| 2014/0339574 | A1* | 11/2014 | Kang | .................... H01L 27/124 257/88 |

(Continued)

*Primary Examiner* — William F Kraig
*Assistant Examiner* — Khatib Rahman
(74) *Attorney, Agent, or Firm* — Birch, Stewart, Kolasch & Birch, LLP

(57) ABSTRACT

An organic light emitting display device comprising a display panel including an active area where an image is displayed and a pad area corresponding to a non-display area, the display device includes a first substrate and a second substrate, which face each other, an organic light emitting diode arranged on the first substrate in the active area, a signal pad arranged on the first substrate in the pad area, a connection electrode connected with one side of the signal pad, and a flexible circuit film connected with the connection electrode, wherein the signal pad includes a plurality of lines arranged by interposing an insulating film therebetween, and the plurality of lines are electrically connected with each other.

11 Claims, 12 Drawing Sheets

(51) Int. Cl.
- *G02F 1/1362* (2006.01)
- *G02F 1/1335* (2006.01)
- *G02F 1/1368* (2006.01)
- *H01L 23/60* (2006.01)
- *H01L 27/12* (2006.01)
- *H01L 27/32* (2006.01)
- *H01L 51/52* (2006.01)
- *G02F 1/1333* (2006.01)

(52) U.S. Cl.
CPC .... *G02F 1/13458* (2013.01); *G02F 1/133308* (2013.01); *G02F 1/133512* (2013.01); *G02F 1/133514* (2013.01); *G02F 1/136204* (2013.01); *H01L 23/60* (2013.01); *H01L 27/124* (2013.01); *H01L 27/3272* (2013.01); *H01L 27/3276* (2013.01); *H01L 51/5203* (2013.01); *H01L 51/5237* (2013.01); *G02F 1/13336* (2013.01); *G02F 2001/13332* (2013.01); *G02F 2201/123* (2013.01); *G02F 2202/22* (2013.01)

(58) Field of Classification Search
CPC ............. G02F 1/13458; G02F 1/13452; G02F 2201/123
See application file for complete search history.

(56) References Cited

U.S. PATENT DOCUMENTS

| | | |
|---|---|---|
| 2015/0177542 A1 | 6/2015 | Katou |
| 2015/0340645 A1* | 11/2015 | Guo ................... H01L 51/5237 257/40 |

* cited by examiner

DISPLAY DEVICE

CROSS-REFERENCE TO RELATED APPLICATIONS

This Application is a Continuation of U.S. Patent Application No. 15/200,787filed on Jul. 1, 2016 (now U.S. Pat. No. 9,947,652 issued Apr. 17, 2018), which claims the priority benefit under 35 U.S.C. § 119(a) to Korean Patent Application No. 10-2015-0095395filed in the Republic of Korea on Jul. 3, 2015, all of which are hereby expressly incorporated by reference into the present application.

BACKGROUND OF THE INVENTION

Field of the Invention

The present invention relates to a display device, and more particularly, to a structure of connecting a panel driver to a side of a display panel and an electrostatic discharge structure.

Discussion of the Related Art

Display devices such as a liquid crystal display device, a plasma display panel, and an organic light emitting display device have been developed up to now.

The display device includes a display panel for displaying an image, and a panel driver for driving the display panel. Hereinafter, a connection structure of a display panel and a panel driver according to the related art will be described.

FIG. 1A is a brief plane view illustrating a display device according to the related art. FIG. 1B is a cross-sectional view taken along line I-I of FIG. 1A.

Referring to FIGS. 1A and 1B, the display device according to the related art includes a lower substrate 10, an upper substrate 20, a flexible circuit film 40, and a printed circuit board (PCB) 50.

A display panel is formed by combination of the lower substrate 10 and the upper substrate 20, and a panel driver is formed by combination of the flexible circuit film 40 and the printed circuit board (PCB) 50.

The lower substrate 10 is provided with various signal lines, and a signal pad 11 is provided at an end of the signal line. The signal pad 11 is connected with the flexible circuit film 40. In more detail, the flexible circuit film 40 is attached to an upper surface of the signal pad 11. To this end, the upper surface of the signal pad is exposed. That is, the lower substrate 10 is more extended than the upper substrate 20, and the signal pad 11 is formed on the extended lower substrate 10. The flexible circuit film 40 is connected with the printed circuit board (PCB) 50.

In the aforementioned display device according to the related art, the flexible circuit film 40 is attached to the upper surface of the signal pad 11. Therefore, a problem occurs in that a bezel area is increased to expose the upper surface of the signal pad 11. Also, there is limitation in realizing a display device of various esthetic senses due to a step difference in the bezel area.

FIG. 2 is a view illustrating an electrostatic discharge (ESD) structure of a display device according to the related art.

Referring to FIG. 2, in the display device according to the related art, for electrostatic discharge, a transparent conductive layer 22 of a transparent conductive material such as indium tin oxide (ITO) is formed on an upper substrate 20, and the transparent conductive layer 22 of the upper substrate 20 is electrically connected with an electrostatic pad 12 arranged on the lower substrate by using a connection electrode 30. At this time, the connection electrode 30 may be made of Ag having excellent conductivity. And, the electrostatic pad 12 is electrically connected with a case top 70 by using a chip on film (COF) 60.

In the electrostatic discharge (ESD) structure of the display device according to the related art, since the upper substrate 20 should electrically be connected with the lower substrate 10 by using the connection electrode 30 and the lower substrate 10 should electrically be connected with the case top 70 by using the COF 60, a problem occurs in that a bezel area is increased. Also, a process of forming the electrostatic discharge structure is complicated, whereby problems occur in that productivity is deteriorated and a manufacturing cost is increased.

Recently, a video wall display device has been developed, which realizes a large-sized display by arranging a plurality of display panels in a tile pattern. If the bezel area of the display panel is increased, an external esthetic sense of the video wall display device is deteriorated. Particularly, an interval between the display panels is increased so as not to smoothly display an image, whereby a problem occurs in that display quality is deteriorated.

SUMMARY OF THE INVENTION

Accordingly, the present invention is directed to a display device that substantially obviates one or more problems due to limitations and disadvantages of the related art.

An advantage of the present invention is to provide a display device which may reduce a bezel area and remove a step difference in the bezel area.

Another advantage of the present invention is to provide a display device having a structure for connecting a panel driver to a side of the display panel.

Other advantage of the present invention is to provide an electrostatic discharge (ESD) structure in a display device having a structure for connecting a panel driver to a side of a display panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device according to an embodiment of the present invention comprises a display panel including an active area where an image is displayed and a pad area corresponding to a non-display panel, the display device comprising a first substrate and a second substrate which face each other and are bonded to each other to constitute the display panel. A signal pad is arranged on the first substrate, and a connection electrode is connected with one side of the signal pad. A flexible circuit film connected with the connection electrode is arranged. In this case, the signal pad includes a plurality of lines arranged by interposing an insulating film therebetween, wherein the plurality of lines are electrically connected with each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1A:
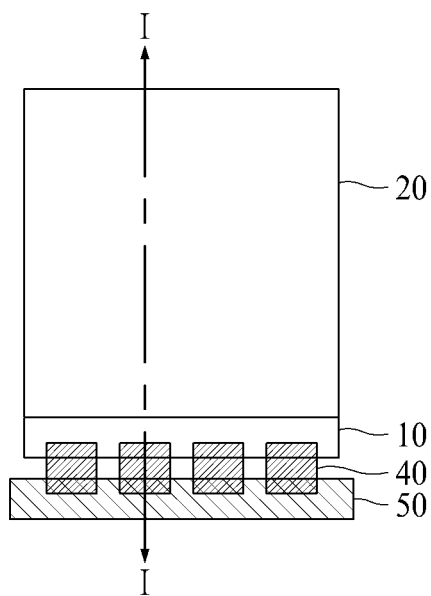
FIG. 1A is a brief plane view illustrating a display device according to the related art.
Figure 1B:
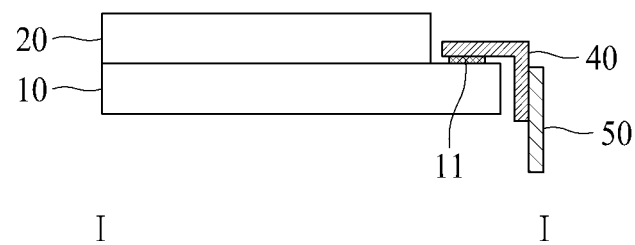
FIG. 1B is a cross-sectional view taken along line I-I of FIG. 1A.
Figure 2:
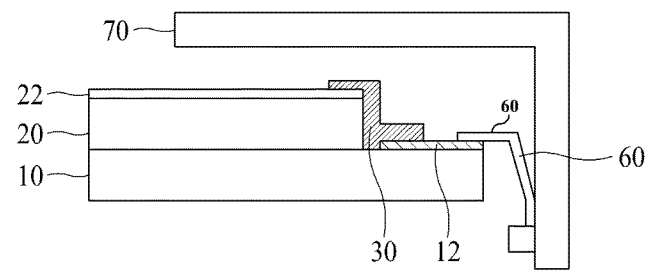
FIG. 2 is a view illustrating an electrostatic discharge (ESD) structure of a display device according to the related art.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two relevant portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

First of all, a structure for connecting a panel driver to a side of a display panel will be described and followed by an electrostatic discharge (ESD) structure.

First Embodiment

Figure 3:
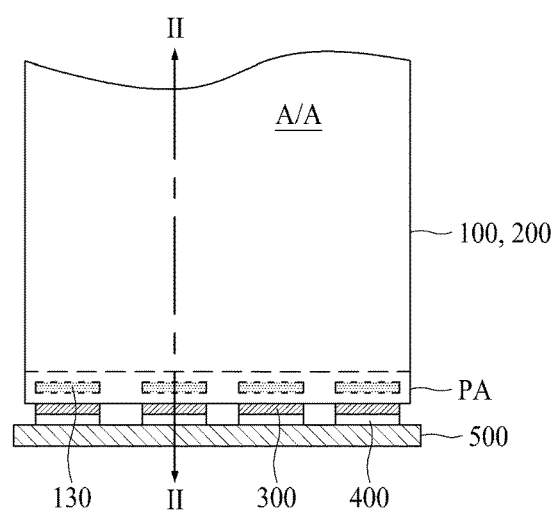
FIG. 3 is a brief plane view illustrating a display device according to the embodiments of the present invention.
Figure 4A:
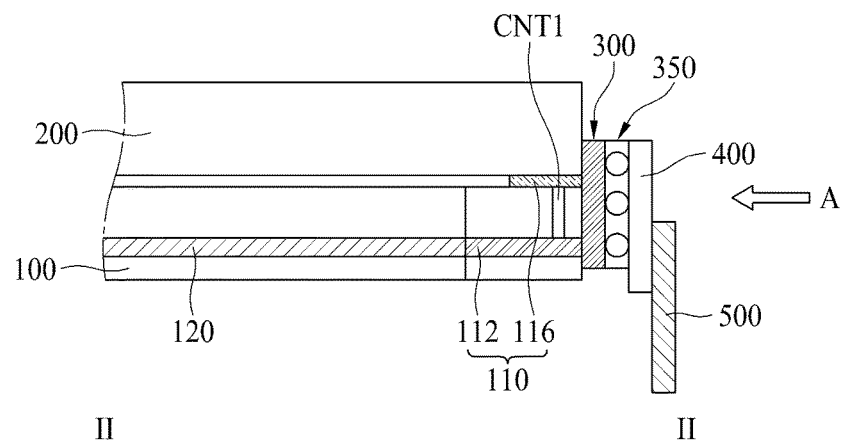
FIG. 4A is a brief view illustrating a display device according to a first embodiment of the present invention, especially illustrating a side bonding contact structure taken along line II-II of FIG. 3.
Figure 4B:
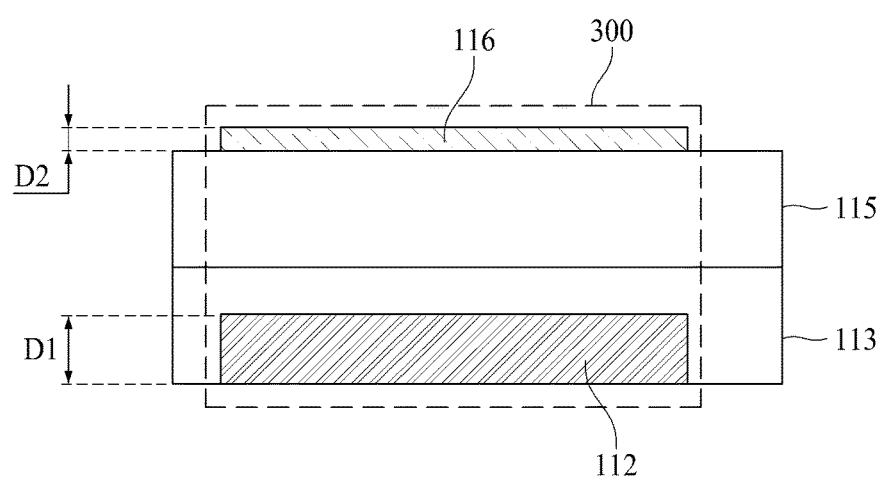
FIG. 4B is a view illustrating a side bonding contact structure viewed in a direction A of FIG. 4A.

FIG. 3 is a brief plane view illustrating a display device according to the embodiments of the present invention. FIG. 4A is a brief view illustrating a display device according to the first embodiment of the present invention, especially illustrating a side bonding contact structure taken along line II-II of FIG. 3. FIG. 4B is a view illustrating a side bonding contact structure viewed in a direction A of FIG. 4A.

Referring to FIGS. 3, 4A and 4B, the display device according to the first embodiment of the present invention includes a first substrate 100, a second substrate 200, a flexible circuit film 400, and a printed circuit board (PCB) 500. The first substrate 100 and the second substrate 200 are bonded to each other to constitute a display panel. The flexible circuit film 400 and the printed circuit board 500 constitute a panel driver.

The display panel includes an active area A/A where an image is displayed, and a pad area PA corresponding to a non-display area. The pad area PA is arranged outside the active area A/A. A plurality of signal pads 110 are arranged in the pad area PA, and each signal pad 110 has a multi-layer structure. Also, a contact portion 130 for electrically connecting multi-layers of the respective signal pads 110 is arranged in the pad area PA.

The flexible circuit film 400 is attached to a side of the display panel, and the printed circuit board 500 is connected to the flexible circuit film 400.

The first substrate 100 and the second substrate 200 have the same patterns as each other. The first substrate 100 and the second substrate 200 may have the same sized quadrangles as each other. That is, according to the first embodiment of the present invention, one end of the first substrate 100 is matched with one end of the second substrate 200 in an area to which the flexible circuit film 400 is attached, unlike the related art in which the first substrate 10 is more extended than the second substrate 20 in the area to which the flexible circuit film 40 is attached.

Since the first substrate 100 is not more extended than the second substrate 200, the flexible circuit film 400 is attached to the side of the display panel without being attached to an upper surface of the first substrate 100.

Although the drawing illustrates that one flexible circuit film 400 and one printed circuit board 500 are connected to one side of the display panel, for example, a lower side of the display panel, another one flexible circuit film 400 and another one printed circuit board 500 may additionally be connected to the other side of the display panel, for example, a left side of the display panel.

The aforementioned size and pattern of the first substrate 100 and the second substrate 200 and the aforementioned flexible circuit film 400 attached to the side of the display panel will equally be applied to the display device according to the second to fifth embodiments of the present invention, which will be described later.

As shown in FIG. 4A, the first substrate 100 and the second substrate 200 face each other, and have the same lengths as each other. Also, one end of the first substrate 100 is matched with one end of the second substrate 200, and the other end of the first substrate 100 is matched with the other end of the second substrate 200. However, the present invention is not limited to this case, and details of the first substrate 100 and the second substrate 200 may be varied depending on the display device which is used.

For example, if the display device according to the present invention is applied to a liquid crystal display device, a thin film transistor and a pixel electrode may be formed on the first substrate 100, and a black matrix and a color filter may be formed on the second substrate 200. And, a liquid crystal layer may be formed between the first substrate 100 and the second substrate 200. However, the present invention is not limited to this case, and various modifications known in the art can be made in the display device.

Also, the display device according to the present invention may be provided in various modes known in the art, such as a Twisted Nematic (TN) mode, an In-Plane Switching (IPS) mode, a Vertical Alignment (VA) mode, or a Fringe Field Switching (FFS) mode. Meanwhile, various modifications may be made in the first substrate 100 and the second substrate 200 depending on the various modes of the display device.

Also, if the display device according to the present invention is applied to an organic light emitting display device, an organic light emitting diode, which includes a thin film transistor, an anode, a light emitting layer and a cathode, may be formed on the first substrate 100. The second substrate 200 may be formed of, but not limited to, an encapsulation substrate. Various modifications known in the art may be made in the second substrate 200.

Referring to FIGS. 4A and 4B again, a line 120 is formed on the first substrate 100, and the signal pad 110 is connected to an end of the line 120. The line 120 may be made of a signal line such as a gate line, a data line, or a common voltage line. As another example, the line 120 may be made of a non-signal line such as an electrostatic discharge line.

Each of the plurality of signal pads 110 is formed in a multi-layer structure. In more detail, the signal pad 110 includes a first line 112 and a second line 116. A first insulating film 113 and a second insulating film 115 are arranged between the first line 112 and the second line 116.

In this case, a gate insulating film of an inorganic material (for example, oxide silicon or nitride silicon) may be used as the first insulating film 113, and a passivation film of an organic material (for example, photoacryl) may be used as the second insulating film 115.

The first line 112 may be arranged on the same layer as the gate line arranged in the active area A/A. The first line 112 may have a thickness D1 of 400 nm to 500 nm.

The second line 116 may have a thickness D2 of 20 nm to 40 nm. The first line 112 and the second line 116 are electrically connected with each other through a first contact hole CNT1.

The line 120 and the signal pad 110 are electrically connected with each other. For example, as shown in FIG. 4A, the line 120 may be arranged on the same layer as the first line 112 of the signal pad 110 and therefore may be connected with the first line 112 in one body.

Although one line constituting the signal pad 110 is formed on the same layer as the line 120 in one body as shown, the present invention is not limited to this case.

For example, the line 120 may be made of a data line provided on the gate insulating film, and the signal pad 110 may be made of a data pad provided below the gate insulating film. In this case, the data pad may be connected with the data line through a contact hole provided in the gate insulating film.

One end of the first substrate 100 is matched with one end of the second substrate 200 in the area where the signal pad 110 is formed. Therefore, the flexible circuit film 400 is electrically connected to one side of the signal pad 110 unlike the related art that the flexible circuit film 40 is connected to the upper surface of the signal pad 11.

In this case, since one side of the signal pad 110, which is connected to the flexible circuit film 400, has a width relatively smaller than that of the upper surface of the signal pad 110, connection property between the signal pad 110 and the flexible circuit film 400 may be deteriorated.

To improve connection property between the signal pad 110 and the flexible circuit film 400, in the display device of the present invention, the signal pad 110 is comprised of a multi-layer made of the first line 112 and the second line 116, whereby an area where the signal pad 110 is connected with the flexible circuit film 400 is increased.

Also, in the display device of the present invention, a connection electrode 300 is formed at one side of the signal pad 110 to improve connection property between the signal pad 110 and the flexible circuit film 400. In this case, one signal pad 110 and one connection electrode 300 are connected with each other one to one.

The connection electrode 300 connected with the signal pad 110 is formed on sides of the first substrate 100 and the second substrate 200. The connection electrode 300 is formed in contact with each side of the first substrate 100 and the second substrate 200, at which the signal pad 110 is formed, and at the same time is directly connected with one side of the signal pad 110. The connection electrode 300 may be made of, but not limited to, Ag having excellent conductivity.

An adhesive layer 350 is arranged between the connection electrode 300 and the flexible circuit film 400 to attach the flexible circuit film 400 to the connection electrode 300. Since the adhesive layer 350 is provided with a conductive ball therein, the connection electrode 300 is electrically connected with the flexible circuit film 400 through the conductive ball.

The flexible circuit film 400 is not formed on the first substrate 100 but arranged vertically along the sides of the first substrate 100 and the second substrate 200. That is, the flexible circuit film 400 is attached to the sides of the first substrate 100 and the second substrate 200 in a manner of side bonding.

Also, the printed circuit board 500 is connected to the flexible circuit film 400. A chip such as a driving integrated circuit may be formed on the flexible circuit film 400 to constitute a chip on film (COF) structure. However, the present invention is not limited to the COF structure. Also, a lead line is provided on the flexible circuit film 400, and is connected with the connection electrode 300 through the conductive ball of the adhesive layer 350.

The printed circuit board 500 applies various signals to the display panel through the flexible circuit film 400. A timing controller, various power circuits, or a memory device may be packaged on the printed circuit board 500.

The adhesive layer 350 is formed on the side of the connection electrode 300. A plurality of conductive balls are included in the adhesive layer 350.

The adhesive layer 350 is formed even on the side of the first substrate 100 and the side of the second substrate 200. At least one of the plurality of conductive balls is in contact with the connection electrode 300, and at least another one of the plurality of conductive balls is arranged between the plurality of connection electrodes 300.

The flexible circuit film 400 is formed on the adhesive layer 350. The lead line is formed on the surface of the flexible circuit film 400, which faces the adhesive layer 350. The lead line is electrically connected with the connection electrode 300 through the conductive ball. That is, one side of the conductive ball is in contact with the connection electrode 300, and the other side of the conductive ball is in contact with the lead line. The printed circuit board 500 is formed on the flexible circuit film 400.

According to the first embodiment of the present invention, the signal pad 110 is electrically connected with the printed circuit board 500 through the connection electrode 300, the conductive ball and the lead line.

Figure 8:
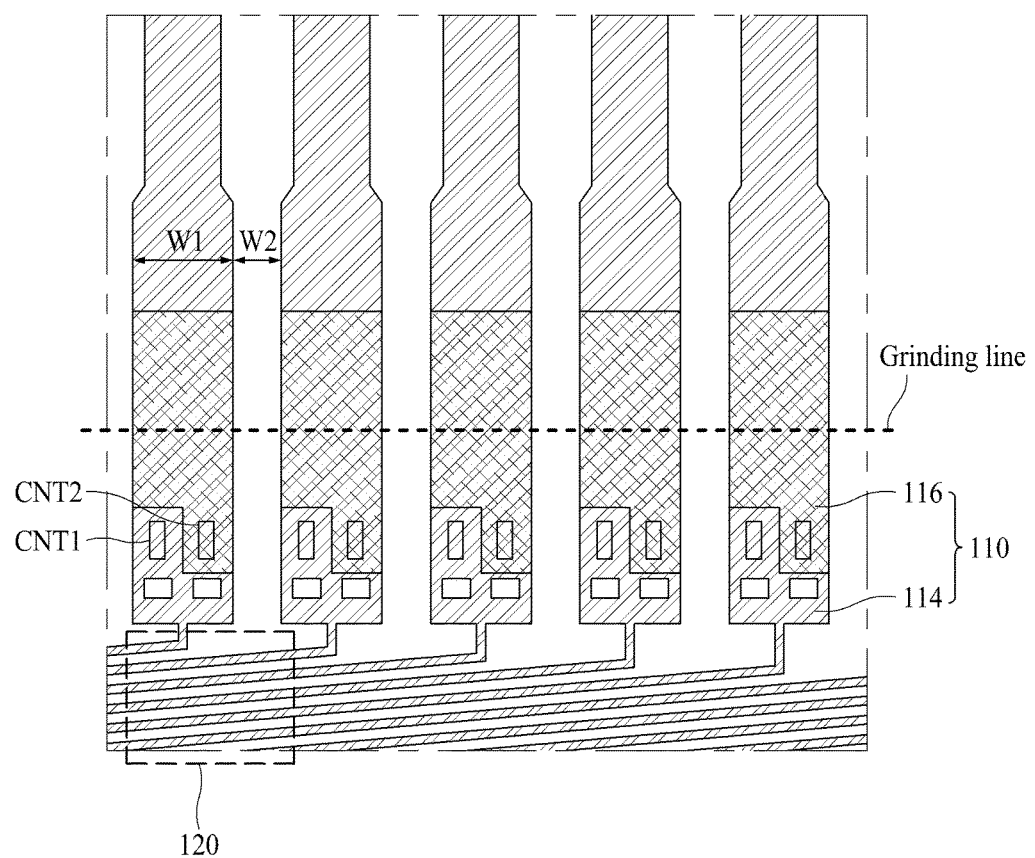
FIG. 8 is a view illustrating a side bonding contact structure viewed in a direction B of FIG. 7B, especially illustrating a plurality signal pads and a plurality of lines, which are arranged on the first substrate.

As shown in FIG. 8, a unit display panel is manufactured by cutting an original plate, which is obtained by bonding the first substrate and the second substrate to each other, along a grinding line during a manufacturing process. At this time, the signal pad exposed at the side of the display panel may be lost, whereby a contact area between the signal pad and the connection electrode may be reduced. For this reason, a contact defect may be caused. If the contact defect of the signal pad and the connection electrode occurs, no signal is applied to the active area A/A even though a signal is applied to the signal pad, whereby a lighting defect occurs in pixels connected to a corresponding line.

According to the first embodiment of the present invention, the signal pad 110 is comprised of the first line 112 and the second line 116, whereby a wide contact area with the connection electrode 300 is formed. Therefore, electrical connection between the signal pad 110 and the connection electrode 300 is excellent, and physical adhesion therebetween is also very excellent, whereby a connection defect caused by side processing of the display panel may be reduced.

Also, the connection electrode 300 is connected with the signal pad 110 at the side of each of the first substrate 100 and the second substrate 200, and the flexible circuit film 400 is attached to the connection electrode 300 at the sides of the first substrate 100 and the second substrate 200, whereby the first substrate 100 may not be required to be more extended than the second substrate 200 to expose the upper surface of the signal pad 100 like the related art. Therefore, according to the present invention, it is advantageous that a bezel area is reduced as compared with the related art.

Also, since one end and the other end of the first substrate 100 are matched with those of the second substrate 200, it is advantageous that a step difference is prevented from being generated in the bezel area. Particularly, since the signal pad 110 is comprised of the first line 112 and the second line 116 to form a wide contact area, electrical connection and physical adhesion may be improved even though a side bonding contact structure is used.

Second Embodiment

Figure 5A:
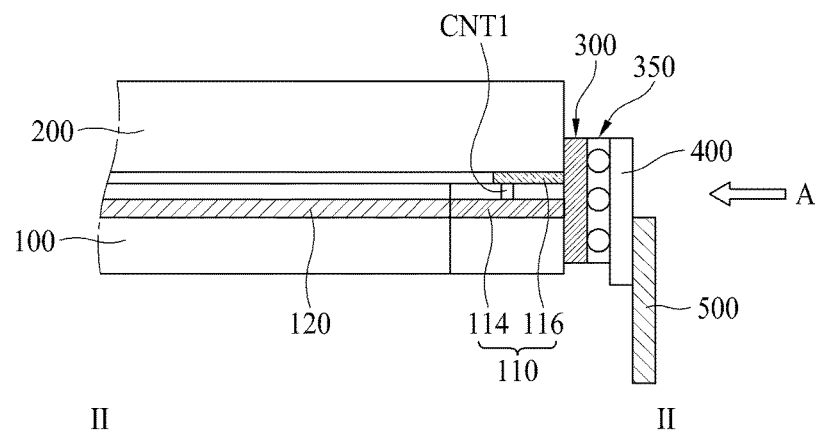
FIG. 5A is a brief view illustrating a display device according to a second embodiment of the present invention, especially illustrating a side bonding contact structure taken along line II-II of FIG. 3.
Figure 5B:
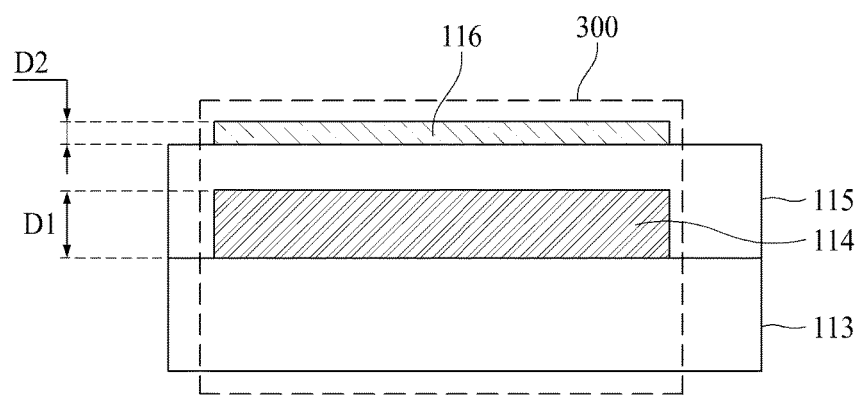
FIG. 5B is a view illustrating a side bonding contact structure viewed in a direction A of FIG. 5A.

FIG. 5A is a brief view illustrating a display device according to the second embodiment of the present invention, especially illustrating a side bonding contact structure taken along line II-II of FIG. 3. FIG. 5B is a view illustrating a side bonding contact structure viewed in a direction A of FIG. 5A. In description of the display device according to the second embodiment of the present invention, detailed description of the same elements as those of the first embodiment may be omitted.

Referring to FIGS. 5A and 5B, the display device according to the second embodiment of the present invention includes a first substrate 100, a second substrate 200, a flexible circuit film 400, and a printed circuit board (PCB) 500.

The first substrate 100 and the second substrate 200 are bonded to each other to constitute a display panel. The display panel includes an active area A/A where an image is displayed, and a pad area PA corresponding to a non-display area. The pad area PA is arranged outside the active area A/A. A contact portion 130 for electrically connecting each of a plurality of signal pads 110 with each of a plurality of connection electrodes 300 is arranged in the pad area PA. The flexible circuit film 400 and the printed circuit board 500 constitute a panel driver.

The display panel includes an active area A/A where an image is displayed, and a pad area PA corresponding to a non-display area. The pad area PA is arranged outside the active area A/A. A plurality of signal pads 110 are arranged in the pad area PA, and each signal pad 110 has a multi-layer structure.

The flexible circuit film 400 is attached to a side of the display panel, and the printed circuit board 500 is connected to the flexible circuit film 400.

Since the first substrate 100 is not more extended than the second substrate 200, the flexible circuit film 400 is attached to the side of the display panel without being attached to an upper surface of the first substrate 100.

Although the drawing illustrates that one flexible circuit film 400 and one printed circuit board 500 are connected to one side of the display panel, for example, a lower side of the display panel, another one flexible circuit film 400 and another one printed circuit board 500 may additionally be connected to the other side of the display panel, for example, a left side of the display panel.

A line 120 is formed on the first substrate 100, and the signal pad 110 is connected to an end of the line 120. The line 120 may be made of a signal line such as a gate line, a data line, or a common voltage line. As another example, the line 120 may be made of a non-signal line such as an electrostatic discharge line.

Each of the plurality of signal pads 110 is formed in a multi-layer structure. In more detail, the signal pad 110 includes a first line 114 and a second line 116. Only a second insulating film 115 is arranged between the first line 114 and the second line 116, and a first insulating film 113 is arranged below the first line 114.

In this case, a gate insulating film of an inorganic material (for example, oxide silicon or nitride silicon) may be used as the first insulating film 113, and a passivation film of an organic material (for example, photoacryl) may be used as the second insulating film 115.

The first line 114 may be arranged on the same layer as the gate line arranged in the active area A/A. The first line 114 may have a thickness D1 of 400 nm to 500 nm.

The second line 116 may have a thickness D2 of 20 nm to 40 nm. The first line 114 and the second line 116 are electrically connected with each other through a first contact hole CNT1.

The line 120 and the signal pad 110 are electrically connected with each other. For example, as shown in FIG. 5A, the line 120 may be arranged on the same layer as the first line 114 of the signal pad 110 and therefore may be connected with the first line 114 in one body.

Although one line constituting the signal pad 110 is formed on the same layer as the line 120 in one body as shown, the present invention is not limited to this case.

One end of the first substrate 100 is matched with one end of the second substrate 200 in the area where the signal pad 110 is formed. Therefore, the flexible circuit film 400 is electrically connected to one side of the signal pad 110 unlike the related art that the flexible circuit film 40 is connected to the upper surface of the signal pad 11.

To improve connection property between the signal pad 110 and the flexible circuit film 400, in the display device of the present invention, the signal pad 110 is comprised of a multi-layer made of the first line 114 and the second line 116, whereby an area where the signal pad 110 is connected with the flexible circuit film 400 is increased.

Also, in the display device of the present invention, a connection electrode 300 is formed at one side of the signal pad 110 to improve connection property between the signal pad 110 and the flexible circuit film 400. In this case, one signal pad 110 and one connection electrode 300 are connected with each other one to one.

The connection electrode 300 is formed in contact with each side of the first substrate 100 and the second substrate 200, at which the signal pad 110 is formed, and at the same time is directly connected with one side of the signal pad 110. The connection electrode 300 may be made of, but not limited to, Ag having excellent conductivity.

An adhesive layer 350 is arranged between the connection electrode 300 and the flexible circuit film 400 to attach the flexible circuit film 400 to the connection electrode 300. Since the adhesive layer 350 is provided with a conductive ball therein, the connection electrode 300 may electrically be connected with the flexible circuit film 400 through the conductive ball.

The flexible circuit film 400 is not formed on the first substrate 100 but arranged vertically along the sides of the first substrate 100 and the second substrate 200. That is, the flexible circuit film 400 is attached to the sides of the first substrate 100 and the second substrate 200 in a manner of side bonding.

Also, a lead line is provided on the flexible circuit film 400, and is connected with the connection electrode 300 through the conductive ball of the adhesive layer 350.

The adhesive layer 350 is formed on the side of the connection electrode 300. The adhesive layer 350 is formed even on the side of the first substrate 100 and the side of the second substrate 200.

The flexible circuit film 400 is formed on the adhesive layer 350. The lead line is formed on the surface of the flexible circuit film 400, which faces the adhesive layer 350. The lead line is electrically connected with the connection electrode 300 through the conductive ball. That is, one side of the conductive ball is in contact with the connection electrode 300, and the other side of the conductive ball is in contact with the lead line. The printed circuit board 500 is formed on the flexible circuit film 400.

According to the second embodiment of the present invention, the signal pad 110 is electrically connected with the printed circuit board 500 through the connection electrode 300, the conductive ball and the lead line.

According to the second embodiment of the present invention, the signal pad 110 is comprised of the first line 114 and the second line 116, whereby a wide contact area with the connection electrode 300 is formed. Therefore, electrical connection between the signal pad 110 and the connection electrode 300 is excellent, and physical adhesion therebetween is also very excellent, whereby a connection defect caused by side processing of the display panel may be reduced.

Also, the connection electrode 300 is connected with the signal pad 110 at the side of each of the first substrate 100 and the second substrate 200, and the flexible circuit film 400 is attached to the connection electrode 300 at the sides of the first substrate 100 and the second substrate 200, whereby the first substrate 100 may not be required to be more extended than the second substrate 200 to expose the upper surface of the signal pad 100 like the related art.

Therefore, according to the present invention, it is advantageous that a bezel area is reduced as compared with the related art. Also, since one end and the other end of the first substrate 100 are matched with those of the second substrate 200, it is advantageous that a step difference is prevented from being generated in the bezel area. Particularly, since the signal pad 110 is comprised of the first line 114 and the second line 116 to form a wide contact area, electrical connection and physical adhesion may be improved even though a side bonding contact structure is used.

Third Embodiment

Figure 6A:
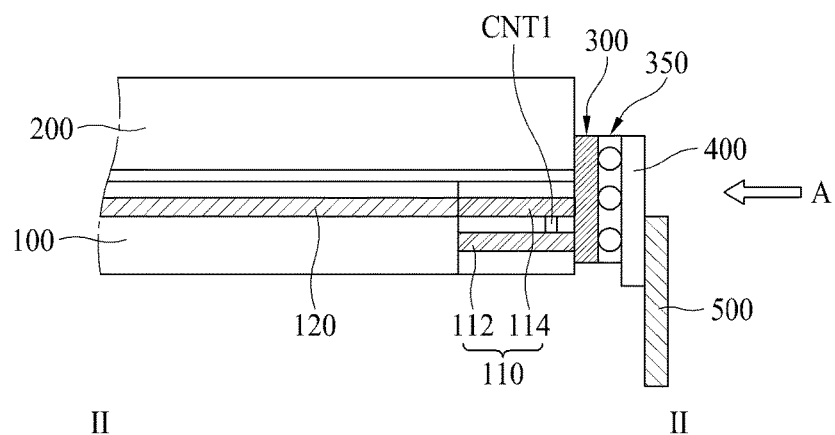
FIGS. 6A and 6B are brief views illustrating a display device according to a third embodiment of the present invention, especially illustrating a side bonding contact structure taken along line II-II of FIG. 3.
Figure 6B:
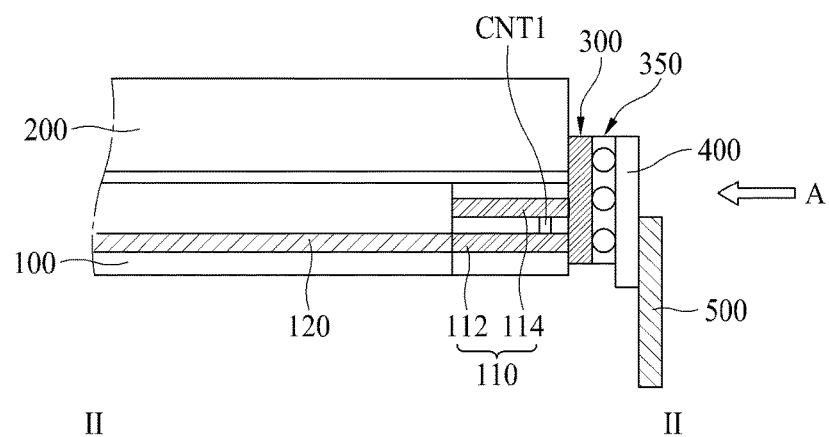
Figure 6C:
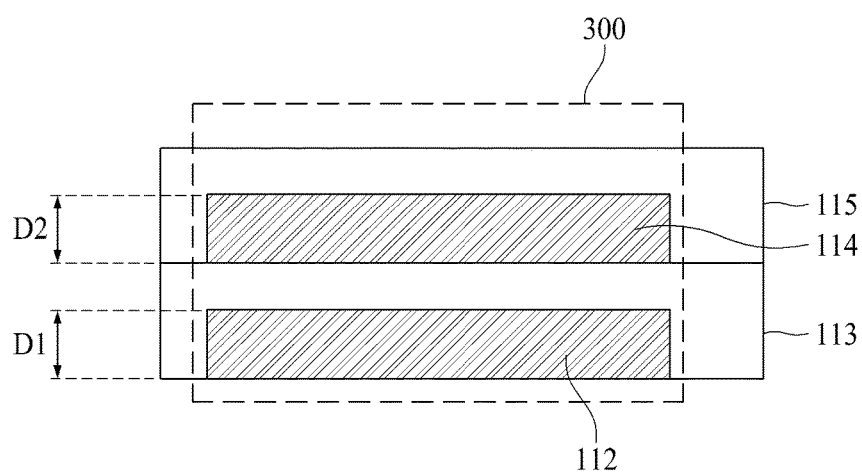
FIG. 6C is a view illustrating a side bonding contact structure viewed in a direction A of FIG. 6A or 6B.

FIGS. 6A and 6B are brief views illustrating a display device according to the third embodiment of the present invention, especially illustrating a side bonding contact structure taken along line II-II of FIG. 3. FIG. 6C is a view illustrating a side bonding contact structure viewed in a direction A of FIG. 6A or 6B. In description of the display device according to the third embodiment of the present invention, detailed description of the same elements as those of the first embodiment may be omitted.

Referring to FIGS. 6A to 6C, the display device according to the third embodiment of the present invention includes a first substrate 100, a second substrate 200, a flexible circuit film 400, and a printed circuit board (PCB) 500.

The first substrate 100 and the second substrate 200 are bonded to each other to constitute a display panel. The display panel includes an active area A/A where an image is displayed, and a pad area PA corresponding to a non-display area. The pad area PA is arranged outside the active area A/A. A contact portion 130 for electrically connecting each of a plurality of signal pads 110 with each of a plurality of connection electrodes 300 is arranged in the pad area PA. The flexible circuit film 400 and the printed circuit board 500 constitute a panel driver.

The display panel includes an active area A/A where an image is displayed, and a pad area PA corresponding to a non-display area. The pad area PA is arranged outside the active area A/A. A plurality of signal pads 110 are arranged in the pad area PA, and each signal pad 110 has a multi-layer structure.

The flexible circuit film 400 is attached to a side of the display panel, and the printed circuit board 500 is connected to the flexible circuit film 400.

Since the first substrate 100 is not more extended than the second substrate 200, the flexible circuit film 400 is attached to the side of the display panel without being attached to an upper surface of the first substrate 100.

Although the drawing illustrates that one flexible circuit film 400 and one printed circuit board 500 are connected to one side of the display panel, for example, a lower side of the display panel, another one flexible circuit film 400 and another one printed circuit board 500 may additionally be connected to the other side of the display panel, for example, a left side of the display panel.

A line 120 is formed on the first substrate 100, and the signal pad 110 is connected to an end of the line 120. The line 120 may be made of a signal line such as a gate line, a data line, or a common voltage line. As another example, the line 120 may be made of a non-signal line such as an electrostatic discharge line.

Each of the plurality of signal pads 110 is formed in a multi-layer structure. In more detail, the signal pad 110 includes a first line 112 and a second line 114. A first insulating film 113 is arranged between the first line 112 and the second line 114, and a second insulating film 115 is arranged on the second line 114.

In this case, a gate insulating film of an inorganic material (for example, oxide silicon or nitride silicon) may be used as the first insulating film 113, and a passivation film of an organic material (for example, photoacryl) may be used as the second insulating film 115.

The first line 112 may be arranged on the same layer as the gate line arranged in the active area A/A. The first line 112 may have a thickness D1 of 400 nm to 500 nm.

The second line 114 may be arranged on the same layer (source/drain layer) as the data line arranged in the active area A/A. The second line 114 may have a thickness D2 of 400 nm to 500 nm. The first line 112 and the second line 114 are electrically connected with each other through a first contact hole CNT1.

The line 120 and the signal pad 110 are electrically connected with each other. For example, as shown in FIG. 6A, the line 120 may be arranged on the same layer as the second line 114 of the signal pad 110 and therefore may be connected with the second line 114 in one body.

For another example, as shown in FIG. 6B, the line 120 may be arranged on the same layer as the first line 112 of the signal pad 110 and therefore may be connected with the first line 112 in one body.

One line constituting the signal pad 110 is formed on the same layer as the line 120 in one body as shown. However, the present invention is not limited to this case.

One end of the first substrate 100 is matched with one end of the second substrate 200 in the area where the signal pad 110 is formed. Therefore, the flexible circuit film 400 is electrically connected to one side of the signal pad 110 unlike the related art that the flexible circuit film 40 is connected to the upper surface of the signal pad 11.

In this case, since one side of the signal pad 110, which is connected to the flexible circuit film 400, has an area relatively smaller than that of the upper surface of the signal pad 110, connection property between the signal pad 110 and the flexible circuit film 400 may be deteriorated.

To improve connection property between the signal pad 110 and the flexible circuit film 400, in the display device of the present invention, the signal pad 110 is comprised of a multi-layer made of the first line 112 and the second line 114, whereby an area where the signal pad 110 is connected with the flexible circuit film 400 is increased.

Also, in the display device of the present invention, a connection electrode 300 is formed at one side of the signal pad 110 to improve connection property between the signal pad 110 and the flexible circuit film 400.

The connection electrode 300 connected with the signal pad is formed on the sides of the first substrate 100 and the second substrate 200. The connection electrode 300 is formed in contact with each side of the first substrate 100 and the second substrate 200, at which the signal pad 110 is formed, and at the same time is directly connected with one side of the signal pad 110. The connection electrode 300 may be made of, but not limited to, Ag having excellent conductivity.

An adhesive layer 350 is arranged between the connection electrode 300 and the flexible circuit film 400 to attach the flexible circuit film 400 to the connection electrode 300. Since the adhesive layer 350 is provided with a conductive ball therein, the connection electrode 300 may electrically be connected with the flexible circuit film 400 through the conductive ball.

The flexible circuit film 400 is not formed on the first substrate 100 but arranged vertically along the sides of the first substrate 100 and the second substrate 200. That is, the flexible circuit film 400 is attached to the sides of the first substrate 100 and the second substrate 200 in a manner of side bonding.

Also, a lead line is provided on the flexible circuit film 400, and is connected with the connection electrode 300 through the conductive ball of the adhesive layer 350. The adhesive layer 350 is formed even on the side of the first substrate 100 and the side of the second substrate 200.

One side of the conductive ball is in contact with the connection electrode 300, and the other side of the conductive ball is in contact with the lead line. The printed circuit board 500 is formed on the flexible circuit film 400.

According to the third embodiment of the present invention, the signal pad 110 is electrically connected with the printed circuit board 500 through the connection electrode 300, the conductive ball and the lead line.

According to the third embodiment of the present invention, the signal pad 110 is comprised of the first line 112 and the second line 114, whereby a wide contact area with the connection electrode 300 is formed. As a result, electrical connection between the signal pad 110 and the connection electrode 300 is excellent and physical adhesion therebetween is also very excellent. Therefore, a connection defect caused by side processing of the display panel may be reduced.

Also, the connection electrode 300 is connected with the signal pad 110 at the side of each of the first substrate 100 and the second substrate 200, and the flexible circuit film 400 is attached to the connection electrode 300 at the sides of the first substrate 100 and the second substrate 200, whereby the first substrate 100 may not be required to be more extended than the second substrate 200 to expose the upper surface of the signal pad 100 like the related art.

Therefore, according to the present invention, it is advantageous that a bezel area is reduced as compared with the related art. Also, since one end and the other end of the first substrate 100 are matched with those of the second substrate 200, it is advantageous that a step difference is prevented from being generated in the bezel area. Particularly, since the signal pad 110 is comprised of the first line 112 and the second line 114 to form a wide contact area, electrical connection and physical adhesion may be improved even though a side bonding contact structure is used.

Fourth Embodiment

Figure 7A:
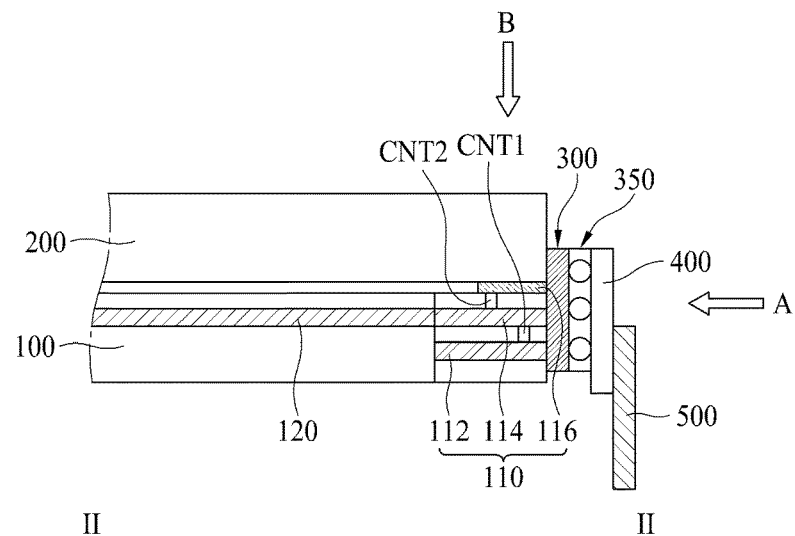
FIGS. 7A and 7B are brief views illustrating a display device according to a fourth embodiment of the present invention, especially illustrating a side bonding contact structure taken along line II-II of FIG. 3.
Figure 7B:
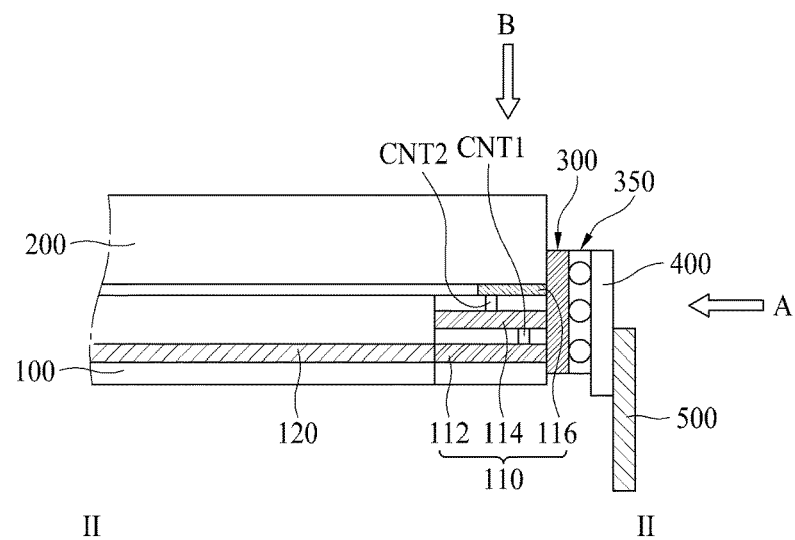

FIG. 3 is a brief plane view illustrating a display device according to the embodiments of the present invention. FIGS. 7A and 7B are brief views illustrating a display device according to the fourth embodiment of the present invention, especially illustrating a side bonding contact structure taken along line II-II of FIG. 3. In description of the display device according to the fourth embodiment of the present invention, detailed description of the same elements as those of the first embodiment may be omitted.

Referring to FIGS. 3, 7A and 7B, the display device according to the fourth embodiment of the present invention includes a first substrate 100, a second substrate 200, a flexible circuit film 400, and a printed circuit board (PCB) 500.

The first substrate 100 and the second substrate 200 are bonded to each other to constitute a display panel. The display panel includes an active area A/A where an image is displayed, and a pad area PA corresponding to a non-display area. The pad area PA is arranged outside the active area A/A. A plurality of signal pads 110 are arranged in the pad area PA, and each signal pad 110 has a multi-layer structure. A contact portion 130 for electrically connecting multi-layers of the plurality of signal pads 110 is arranged in the pad area PA. The flexible circuit film 400 and the printed circuit board 500 constitute a panel driver. The flexible circuit film 400 is attached to a side of the display panel, and the printed circuit board 500 is connected to the flexible circuit film 400.

The first substrate 100 and the second substrate 200 have the same patterns as each other. The first substrate 100 and the second substrate 200 may have the same sized quadrangles as each other. That is, according to the fourth embodiment of the present invention, one end of the first substrate 100 is matched with one end of the second substrate 200 in an area to which the flexible circuit film 400 is attached, unlike the related art in which the first substrate 10 is more extended than the second substrate 20 in the area to which the flexible circuit film 40 is attached.

Since the first substrate 100 is not more extended than the second substrate 200, the flexible circuit film 400 is attached to the side of the display panel without being attached to an upper surface of the first substrate 100.

Although the drawing illustrates that one flexible circuit film 400 and one printed circuit board 500 are connected to one side of the display panel, for example, a lower side of the display panel, another one flexible circuit film 400 and another one printed circuit board 500 may additionally be connected to the other side of the display panel, for example, a left side of the display panel.

As shown in FIGS. 7A and 7B, the first substrate 100 and the second substrate 200 face each other, and have the same lengths as each other. Also, one end of the first substrate 100 is matched with one end of the second substrate 200, and the other end of the first substrate 100 is matched with the other end of the second substrate 200. However, the present invention is not limited to this case, and details of the first substrate 100 and the second substrate 200 may be varied depending on the display device which is used.

A line 120 is formed on the first substrate 100, and the signal pad 110 is connected to an end of the line 120. The line 120 may be made of a signal line such as a gate line, a data line, or a common voltage line. As another example, the line 120 may be made of a non-signal line such as an electrostatic discharge line.

Figure 9:
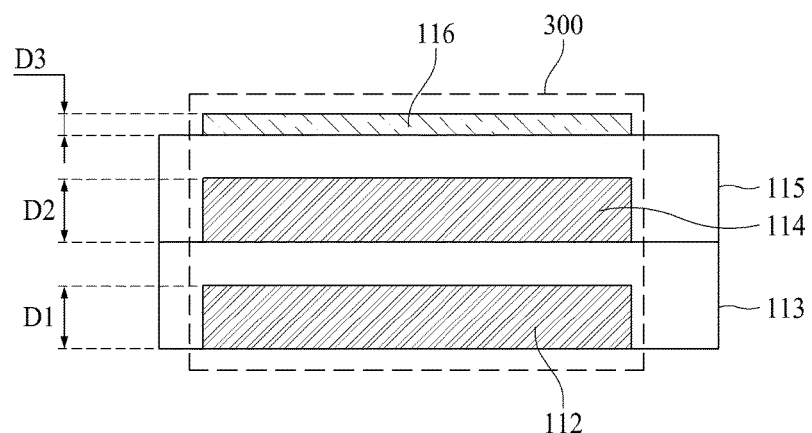
FIG. 9 is a view illustrating a side bonding contact structure viewed in a direction A of FIG. 7B, especially illustrating a section taken along a grinding line shown in FIG. 8.

FIG. 8 is a view illustrating a side bonding contact structure viewed in a direction B of FIG. 7B, especially illustrating a plurality signal pads and a plurality of lines, which are arranged on the first substrate. FIG. 9 is a view illustrating a side bonding contact structure viewed in a direction A of FIG. 7B, especially illustrating a section taken along a grinding line shown in FIG. 8.

Since the first line 112 and the second line 114 are overlapped with each other, the first line 112 is not shown in FIG. 8. Also, since a connection electrode 300 is arranged at the side of the display panel, the connection electrode 300 is not shown in FIG. 8.

Referring to FIGS. 8 and 9 together with FIGS. 7A and 7B, each of the plurality of signal pads 110 is formed in a multi-layer structure. In more detail, the signal pad 110 includes a first line 112, a second line 114, and a third line 116. A first insulating film 113 is arranged between the first line 112 and the second line 114, and a second insulating film 115 is arranged between the second line 114 and the third line 116.

In this case, a gate insulating film of an inorganic material (for example, oxide silicon or nitride silicon) may be used as the first insulating film 113, and a passivation film of an organic material (for example, photoacryl) may be used as the second insulating film 115.

The first line 112 may be arranged on the same layer as the gate line arranged in the active area A/A. The first line 112 may have a thickness D1 of 400 nm to 500 nm.

The second line 114 may be arranged on the same layer (source/drain layer) as the data line arranged in the active area A/A. The second line 114 may have a thickness D2 of 400 nm to 500 nm. The first line 112 and the second line 114 are electrically connected with each other through a first contact hole CNT1.

The third line 116 may be arranged on the same layer as the pixel electrode arranged in the active area A/A. The third line 116 may have a thickness D3 of 20 nm to 40 nm. The second line 114 and the third line 116 are electrically connected with each other through a second contact hole CNT2.

In this way, the first line 112, the second line 114 and the third line 116 are electrically connected with one another through the first contact hole CN1 and the second contact hole CNT2.

The line 120 and the signal pad 110 are electrically connected with each other. For example, as shown in FIG. 7A, the line 120 may be arranged on the same layer as the second line 114 of the signal pad 110 and therefore may be connected with the second line 114 in one body.

For another example, as shown in FIG. 7B, the line 120 may be arranged on the same layer as the first line 112 of the signal pad 110 and therefore may be connected with the first line 112 in one body.

Although one line constituting the signal pad 110 is formed on the same layer as the line 120 in one body as shown, the present invention is not limited to this case.

For example, the line 120 may be made of a data line provided on the gate insulating film, and the signal pad 110 may be made of a data pad provided below the gate insulating film. In this case, the data pad may be connected with the data line through a contact hole provided in the gate insulating film.

One end of the first substrate 100 is matched with one end of the second substrate 200 in the area where the signal pad 110 is formed. Therefore, the flexible circuit film 400 is electrically connected to one side of the signal pad 110 unlike the related art that the flexible circuit film 40 is connected to the upper surface of the signal pad 11.

In this case, since one side of the signal pad 110, which is connected to the flexible circuit film 400, has a width relatively smaller than that of the upper surface of the signal pad 110, connection property between the signal pad 110 and the flexible circuit film 400 may be deteriorated.

To improve connection property between the signal pad 110 and the flexible circuit film 400, in the display device according to the fourth embodiment of the present invention, the signal pad 110 is comprised of the first line 112, the second line 114 and the third line 116, whereby an area where the signal pad 110 is connected with the flexible circuit film 400 is increased.

Also, in the display device of the present invention, the connection electrode 300 is formed at one side of the signal pad 110 to improve connection property between the signal pad 110 and the flexible circuit film 400.

The connection electrode 300 is formed in contact with each side of the first substrate 100 and the second substrate 200, at which the signal pad 110 is formed, and at the same time is directly connected with one side of the signal pad 110. The connection electrode 300 may be made of, but not limited to, Ag having excellent conductivity.

An adhesive layer 350 is arranged between the connection electrode 300 and the flexible circuit film 400 to attach the flexible circuit film 400 to the connection electrode 300. Since the adhesive layer 350 is provided with a conductive ball therein, the connection electrode 300 may electrically be connected with the flexible circuit film 400 through the conductive ball.

The flexible circuit film 400 is formed on the adhesive layer 350. The lead line is formed on the surface of the flexible circuit film 400, which faces the adhesive layer 350. The lead line is electrically connected with the connection electrode 300 through the conductive ball. That is, one side of the conductive ball is in contact with the connection electrode 300, and the other side of the conductive ball is in contact with the lead line. The printed circuit board 500 is formed on the flexible circuit film 400.

The flexible circuit film 400 is not formed on the first substrate 100 but arranged vertically along the sides of the first substrate 100 and the second substrate 200. That is, the flexible circuit film 400 is attached to the sides of the first substrate 100 and the second substrate 200 in a manner of side bonding.

A chip such as a driving integrated circuit may be formed on the flexible circuit film 400 to constitute a chip on film (COF) structure. However, the present invention is not limited to the COF structure. Also, the lead line is provided on the flexible circuit film 400, and is connected with the connection electrode 300 through the conductive ball of the adhesive layer 350.

The printed circuit board 500 applies various signals to the display panel through the flexible circuit film 400. A timing controller, various power circuits, or a memory device may be packaged on the printed circuit board 500.

As shown in FIG. 8, a plurality of signal pads 110 are formed on the first substrate 100. The connection electrode 300 is connected with each of the plurality signal pads 110. That is, one signal pad 110 and one connection electrode 300 are connected with each other one to one.

In this case, a width W1 of the signal pad 110 is wider than a width W2 between the signal pads. For example, the width W1 of the signal pad 110 may be wider than the width W2 between the signal pads by four times. If the signal pad 110 has a width of 120 μm, the width between the signal pads may be 30 μm.

According to the fourth embodiment of the present invention, the signal pad 110 is electrically connected with the printed circuit board 500 through the connection electrode 300, the conductive ball and the lead line.

A unit display panel is manufactured by cutting an original plate, which is obtained by bonding the first substrate and the second substrate to each other, along a grinding line during a manufacturing process. At this time, the signal pad exposed at the side of the display panel may be lost, whereby a contact area between the signal pad and the connection electrode may be reduced. For this reason, a contact defect may be caused. If the contact defect of the signal pad and the connection electrode occurs, no signal is applied to the active area A/A even though a signal is applied to the signal pad, whereby a lighting defect occurs in pixels connected to a corresponding line.

According to the fourth embodiment of the present invention, the signal pad 110 is comprised of the first line 112, the second line 114 and the third line 116, whereby a wide contact area is formed. Therefore, electrical connection between the signal pad 110 and the connection electrode 300 is excellent and physical adhesion therebetween is very excellent, whereby a connection defect caused by side processing of the display panel may be reduced.

Also, the connection electrode 300 is connected with the signal pad 110 at the side of each of the first substrate 100 and the second substrate 200, and the flexible circuit film 400 is attached to the connection electrode 300 at the sides of the first substrate 100 and the second substrate 200, whereby the first substrate 100 may not be required to be more extended than the second substrate 200 to expose the upper surface of the signal pad 100 like the related art.

Therefore, according to the present invention, it is advantageous that a bezel area is reduced as compared with the related art. Also, since one end and the other end of the first substrate 100 are matched with those of the second substrate 200, it is advantageous that a step difference is prevented from being generated in the bezel area. Particularly, since the signal pad 110 is comprised of the first line 112, the second line 114 and the third line 116 to form a wide contact area, electrical connection and physical adhesion may be improved even though a side bonding contact structure is used.

Fifth Embodiment

Figure 10:
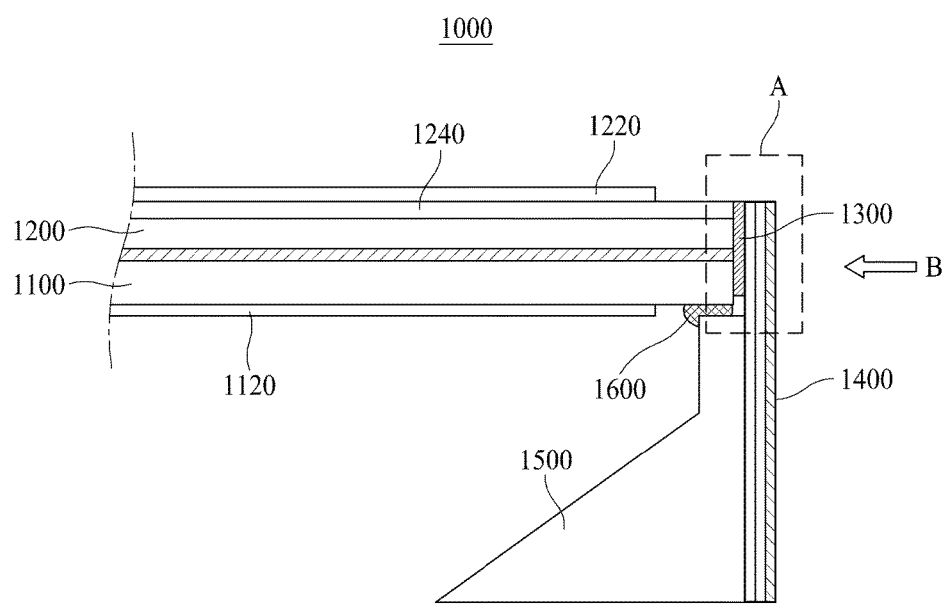
FIG. 10 is a brief cross-sectional view illustrating a display device according to a fifth embodiment of the present invention.
Figure 11:
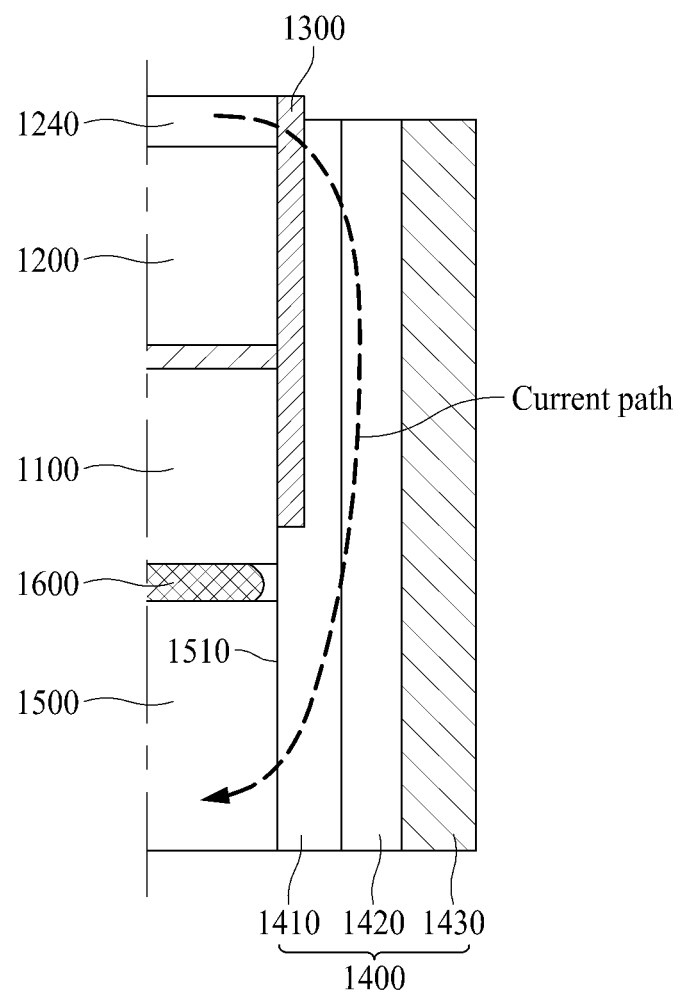
FIG. 11 is an enlarged view illustrating a portion A shown in FIG. 10.

FIG. 10 is a brief cross-sectional view illustrating a display device according to the fifth embodiment of the present invention. FIG. 11 is an enlarged view illustrating a portion A shown in FIG. 10.

Referring to FIGS. 10 and 11, the display device 1000 according to the fifth embodiment of the present invention includes a display panel comprised of a first substrate 1100 and a second substrate 1200, a ground electrode 1300, a conductive light-shielding portion 1400, a metal frame 1500, and an elastic resin 1600.

The first substrate 1100 and the second substrate 1200 are bonded to each other to constitute a display panel. A flexible circuit film 400 and a printed circuit board constitute a panel driver.

An electrostatic discharge layer 1240 is arranged on the display panel, and an upper polarizing film 1220 is arranged on the electrostatic discharge layer 1240. A lower polarizing film 1120 is arranged below the display panel.

The metal frame 1500 has a quadrangle box shape of which upper surface is opened, and has four inner sides inclined at a certain angle. The metal frame 1500 has a wide lower surface but a width is reduced toward an upper surface.

The elastic resin 1600 is arranged on the metal frame 1500, and the display panel is mounted on the elastic resin 1600. The elastic resin 1600 has adhesion to fix the display panel onto the metal frame 1500. Also, the elastic resin 1600 has a predetermined elastic force to prevent the display panel from being damaged by impact.

The flexible circuit film 400 is attached to the side of the display panel, and the printed circuit board is connected to the flexible circuit film 400. A connection structure between the flexible circuit film 400 and the printed circuit board is shown in FIGS. 3 to 9, and its detailed description will be made with reference to these drawings.

The first substrate 1100 and the second substrate 1200 have the same patterns as each other. The first substrate 1100 and the second substrate 1200 may have the same sized quadrangles as each other. That is, according to the fifth embodiment of the present invention, one end of the first substrate 1100 is matched with one end of the second substrate 1200 in an area to which the flexible circuit film 400 is attached. That is, according to the related art, the first substrate 10 is more extended than the second substrate 20 in the area to which the flexible circuit film 40 is attached. However, in the present invention, the first substrate 1100 is not more extended than the second substrate 1200 in the area to which the circuit flexible film 400 is attached.

Since the first substrate 1100 is not more extended than the second substrate 1200, the flexible circuit film 400 is attached to the side of the display panel without being attached to an upper surface of the first substrate 1100.

Figure 12A:
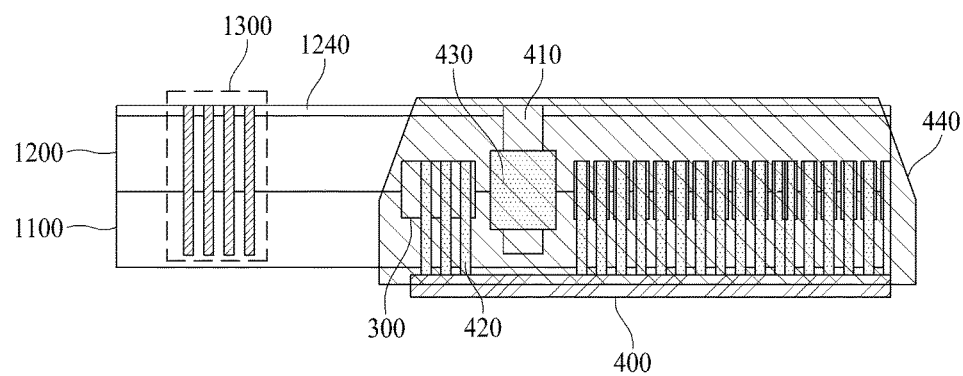
FIG. 12A is a view illustrating a side bonding contact structure and an electrostatic discharge (ESD) structure, which are viewed in a direction B of FIG. 10.
Figure 12B:
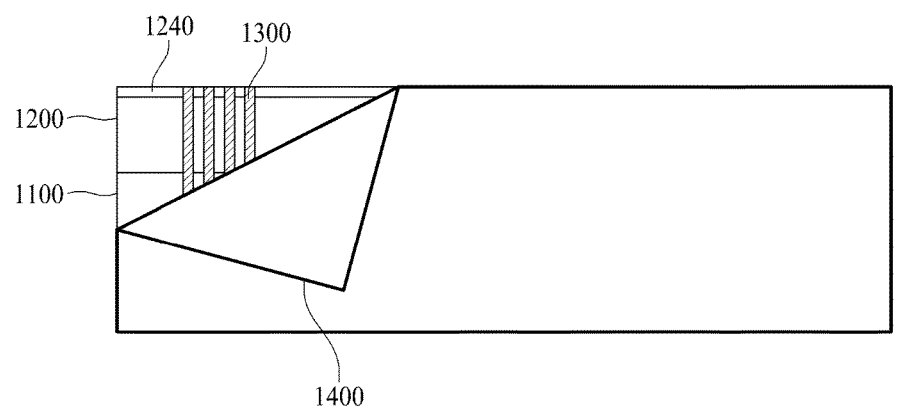
FIG. 12B is a view illustrating that a conductive light shielding portion is attached to a side of a display panel.

FIG. 12A is a view illustrating a side bonding contact structure and an electrostatic discharge (ESD) structure, which are viewed in a direction B of FIG. 10. FIG. 12B is a view illustrating that a conductive light shielding portion is attached to a side of a display panel.

Referring to FIGS. 12A and 12B, a plurality of signal pads are formed on the first substrate 1100, and a plurality of connection electrodes 300 are arranged to cover each of the plurality of signal pads. Since each connection electrode 300 covers each signal pad, the plurality of signal pads are not shown in FIGS. 12A and 12B. A shape and an arrangement structure of the plurality of signal pads are shown in FIGS. 3 to 9, and their detailed description will be made with reference to these drawings.

The plurality of signal pads include a gate pad, a data pad, an electrostatic discharge pad, and a common voltage pad. Various modifications known in the art may be made in a type and arrangement of the signal pads.

The connection electrode 300 is connected to each of the signal pads. That is, one signal pad and one connection electrode 300 are connected to each other one to one. The connection electrode 300 is electrically connected with a lead line 420 formed on the flexible circuit film 400, and the lead line 420 is connected with the printed circuit board.

The flexible circuit film 400 is attached to sides of the first substrate 1100 and the second substrate 1200 through a conductive adhesive layer, and the lead line 420 of the flexible circuit film 400 is electrically connected with the connection electrode 300 through a conductive ball included in the conductive adhesive layer.

In this case, the electrostatic discharge pad of the plurality of signal pads is connected with an ESD pad 430 arranged in the flexible circuit film 400. The ESD pad 430 is connected with an electrostatic discharge layer 1240 formed on the second substrate 1200 through a ground line 410. The electrostatic discharge layer 1240 provided on the second substrate 1200 is electrically connected with the electrostatic discharge pad through the ground line 410. As a result, static electricity generated on the second substrate 1200 may effectively be removed.

Also, a plurality of ground electrodes 1300 are arranged at one side of the display panel. The plurality of ground electrodes 1300 are connected with the electrostatic discharge layer 1240 formed on the second substrate 1200. The electrostatic discharge layer 1240 provided on the second substrate 1200 is electrically connected with the plurality of ground electrodes 1300. The ground electrode 1300 may be made of, but not limited to, Ag having excellent conductivity.

As shown in FIG. 12B, a conductive light-shielding portion 1400 is arranged to cover the plurality of ground electrodes 1300 electrically connected with the electrostatic discharge layer provided on the second substrate 1200, the side of the first substrate 1100 and the side of the second substrate 1200. Although the conductive light-shielding portion 1400 is arranged on the flexible circuit film 400, the flexible circuit film 400 is insulated from the conductive light-shielding portion by an insulating film 440. Therefore, the flexible circuit film 400 is insulated from the plurality of ground electrodes 1300.

The conductive light-shielding portion 1400 is obtained by mixing a conductive metal material with an adhesive material, and is attached to the plurality of ground electrodes 1300 and an outer sidewall 1510 of the metal frame 1500 and therefore the plurality of ground electrodes 1300 are electrically connected with the metal frame 1500. The conductive light-shielding portion 1400 includes a conductive adhesive layer 1410 attached to the outer sidewall 1510 of the metal frame 1500 and the plurality of ground electrodes 1300, a metal film 1420 arranged on the conductive adhesive layer 1410, and a light-shielding film 1430 arranged on the metal film 1420, and is arranged to cover the flexible circuit film 400. Also, the conductive adhesive layer 1410 is also attached onto the flexible circuit film 400 to fix the flexible circuit film 400.

The metal film 1420 may be made of a metal material such as Al or Cu, which has excellent conductivity. As shown from the current path in FIG. 11, static electricity generated from the electrostatic discharge layer 1240 enters the plurality of ground electrodes 1300 and then is discharged to the metal frame 1500 through the metal film 1420.

A light-shielding film 1430 prevents external light from entering the display device 1000 and also prevents light leakage from occurring in a joint portion of the display device 1000. Also, the light-shielding film 1430 is attached to the side of the display device 1000, whereby esthetic appearance of the display device 1000 is improved.

If the related art electrostatic discharge (ESD) structure is applied to the side bonding manner, Ag dotting for electrically connecting the electrostatic discharge layer 1240 with the ESD pad is externally exposed, whereby appearance of the display device is deteriorated. Also, problems occur in that a manufacturing process is complicated and a manufacturing cost is increased.

On the other hand, in the display device 1000 according to the fifth embodiment of the present invention constituted as above, the flexible circuit film 400 is attached to the side of the display panel by the side bonding manner, and the electrostatic discharge (ESD) structure may be arranged at the side of the display panel to reduce a bezel. Also, static electricity generated on the electrostatic discharge layer 1240 may effectively be removed through the plurality of ground electrodes 1300. As a result, appearance of the display device may be improved, and the manufacturing process may be simplified and the manufacturing cost may be reduced.

Figure 13:
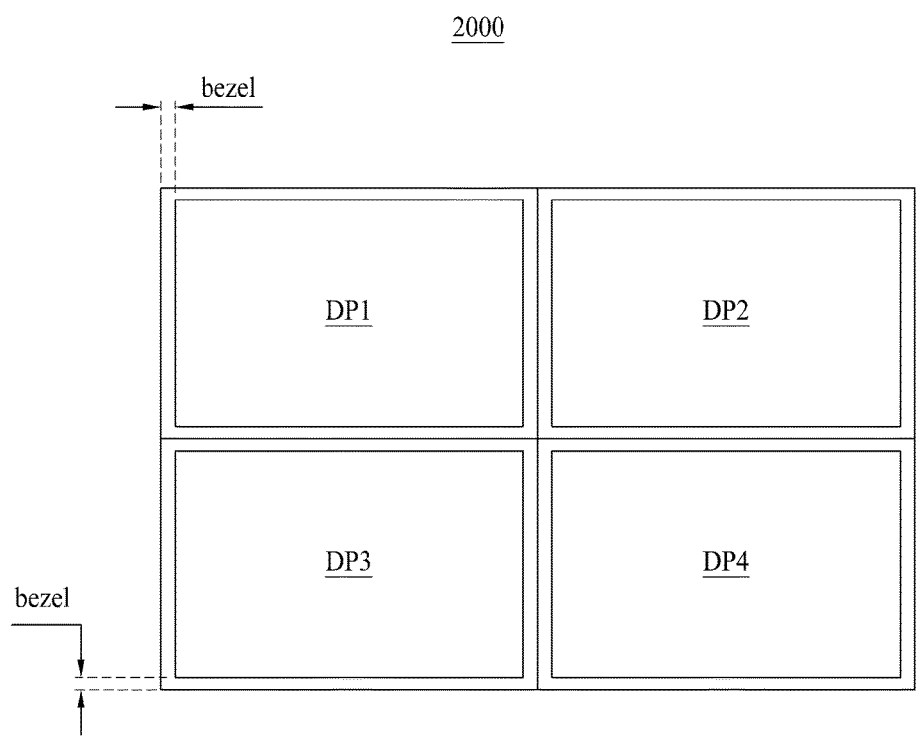
FIG. 13 is a view illustrating a video wall display device constituted by arranging display devices according to the embodiments of the present invention in a tile pattern.

FIG. 13 is a view illustrating a video wall display device constituted by arranging display devices according to the first to fifth embodiments of the present invention in a tile pattern.

Referring to FIG. 13, four (4) display devices DP1 to DP4 according to the first to fifth embodiments of the present invention are arranged in a tile pattern of 2×2 to constitute a video wall display device 2000.

In this way, in the case that the video wall display device 2000 is formed by combination of the plurality of display devices DP1 to DP4, esthetic appearance of the video wall display device is deteriorated if a bezel of each of the display devices DP1 to DP4 is increased. Particularly, intervals among the display devices DP1 to DP4 become wide, whereby an image is not displayed smoothly, whereby a problem occurs in that display quality is deteriorated.

Side bonding may be applied to the display device according to the first to fifth embodiments of the present invention as described above to reduce a bezel, whereby esthetic appearance may be improved when the display device according to the present invention is applied to the video wall display device 2000. Also, since the intervals among the display devices DP1 to DP4 may be formed to become narrow, image may be displayed smoothly, whereby display quality of the video wall display device 2000 may be improved.

The display device of the present invention comprises a display panel including an active area where an image is displayed and a pad area corresponding to a non-display area, the display device comprising a first substrate and a second substrate which face each other and are bonded to each other to constitute the display panel. A signal pad is arranged on the first substrate, and a connection electrode is connected with one side of the signal pad. A flexible circuit film connected with the connection electrode is arranged. In this case, the signal pad includes a plurality of lines arranged by interposing an insulating film therebetween, wherein the plurality of lines are electrically connected with each other.

According to one or more embodiments of the present invention, the plurality of lines of the signal pad include at least two lines of a first line arranged on the same layer as a gate line arranged in the active area, a second line arranged on the same layer as a data line arranged in the active area, and a third line arranged on the same layer as a pixel electrode arranged in the active area.

According to one or more embodiments of the present invention, a first insulating film is arranged between the first line and the second line, the first line and the second line are electrically connected with each other through a first contact hole, a second insulating film is arranged between the second line and the third line, and the second line and the third line are electrically connected with each other through a second contact hole.

According to one or more embodiments of the present invention, the connection electrode is arranged at a side of the first substrate and a side of the second substrate.

According to one or more embodiments of the present invention, the first line and the second line are electrically connected with the connection electrode at one side of each of the first substrate and the second substrate.

According to one or more embodiments of the present invention, the first line and the third line are electrically connected with the connection electrode at one side of each of the first substrate and the second substrate.

According to one or more embodiments of the present invention, the second line and the third line are electrically connected with the connection electrode at one side of each of the first substrate and the second substrate.

According to one or more embodiments of the present invention, the first line, the second line and the third line are electrically connected with the connection electrode at one side of each of the first substrate and the second substrate.

According to one or more embodiments of the present invention, the flexible circuit film is arranged at the side of the first substrate and the side of the second substrate by an adhesive layer.

According to one or more embodiments of the present invention, the display device of the present invention may further comprise an electrostatic discharge layer arranged on the second substrate, and a plurality of ground electrodes electrically connected with the electrostatic discharge layer and arranged at the side of the first substrate and the side of the second substrate.

According to one or more embodiments of the present invention, the display device of the present invention may further comprise a metal frame on which the first substrate and the second substrate are mounted, and a conductive light-shielding portion arranged to cover the plurality of ground electrodes, the side of the first substrate and the side of the second substrate. The conductive light-shielding portion is attached to an external sidewall of the metal frame, whereby the plurality of ground electrodes are electrically connected with the metal frame.

According to one or more embodiments of the present invention, the conductive light-shielding portion includes a conductive adhesive layer attached to the outer sidewall of the metal frame and the plurality of ground electrodes, a metal film arranged on the conductive adhesive layer, and a light-shielding film arranged on the metal film. The conductive light-shielding portion is arranged to cover the flexible circuit film.

According to the embodiments of the present invention, the following advantages can be obtained.

First of all, according to one embodiment of the present invention, the connection electrode is connected with one side of the pad at the side of each of the first substrate and the second substrate, and therefore the flexible circuit film may be attached to the side of each of the first substrate and the second substrate, whereby the first substrate may not be required to be more extended than the second substrate to expose the upper surface of the pad like the related art. Therefore, according to the present invention, it is advantageous that a bezel area is reduced as compared with the related art.

Also, since one end and the other end of the first substrate are matched with those of the second substrate, it is advantageous that a step difference is prevented from being generated in the bezel area.

Also, the connection electrode is connected with the signal pad at the side of each of the first substrate and the second substrate, and the flexible circuit film is attached to the connection electrode at the sides of the first substrate and the second substrate, whereby the first substrate may not be required to be more extended than the second substrate to expose the upper surface of the signal pad like the related art.

Also, the signal pad is connected with the connection electrode by the side bonding manner, whereby it is advantageous that the bezel area is reduced as compared with the related art.

Also, since the signal pad is comprised of the first line, the second line and even the third line to form a wide contact area, electrical connection and physical adhesion may be improved even though a side bonding contact structure is used.

In the display device according to the embodiment of the present invention, the flexible circuit film may be attached to the side of the display panel by the side bonding manner, and the electrostatic discharge (ESD) structure may be arranged at the side of the display panel to reduce a bezel.

Also, static electricity generated on the electrostatic discharge layer may effectively be removed through the plurality of ground electrodes.

Also, appearance of the display device may be improved, and the manufacturing process may be simplified and the manufacturing cost may be reduced.

Side bonding may be applied to the display device according to the first to fifth embodiments of the present invention to reduce a bezel, whereby esthetic appearance may be improved when the display device according to the present invention is applied to the video wall display device.

Also, since the intervals among the display devices may be formed to become narrow, image may be displayed smoothly, whereby display quality of the video wall display device may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising a display panel including an active area where an image is displayed and a pad area corresponding to a non-display area, the display device comprising:
    a first substrate and a second substrate, which face each other;
    an organic light emitting diode arranged on the first substrate in the active area;
    a signal pad arranged on the first substrate in the pad area;
    a connection electrode connected with one side of the signal pad; and
    a flexible circuit film connected with the connection electrode,
    wherein the signal pad includes a plurality of lines arranged by interposing an insulating film therebetween, and the plurality of lines are electrically connected with each other, and
    wherein the signal pad includes at least two lines of a first line arranged on the same layer as a gate line arranged in the active area, a second line arranged on the same layer as a data line arranged in the active area, and a third line arranged on the same layer as a pixel electrode arranged in the active area.

2. The organic light emitting display device of claim 1, wherein the plurality of lines includes the first line, the second line and the third line, and
    wherein a first insulating film is arranged between the first line and the second line, the first line and the second line are electrically connected with each other through a first contact hole, a second insulating film is arranged between the second line and the third line, and the second line and the third line are electrically connected with each other through a second contact hole.

3. The organic light emitting display device of claim 2, wherein the connection electrode is arranged at a side of the first substrate and a side of the second substrate.

4. The organic light emitting display device of claim 3, wherein the first line and the second line are electrically connected with the connection electrode at the side surface of the first substrate.

5. The organic light emitting display device of claim 3, wherein the first line and the third line are electrically connected with the connection electrode at the side surface of the first substrate.

6. The organic light emitting display device of claim 3, wherein the second line and the third line are electrically connected with the connection electrode at the side surface of the first substrate.

7. The organic light emitting display device of claim 3, wherein the first line, the second line and the third line are electrically connected with the connection electrode at one side surface of each of the first substrate and the second substrate.

8. The organic light emitting display device of claim 3, wherein the flexible circuit film is arranged at the side surface of the first substrate and the side surface of the second substrate by an adhesive layer.

9. The organic light emitting display device of claim 8, further comprising:
    an electrostatic discharge layer arranged on the second substrate; and
    a plurality of ground electrodes electrically connected with the electrostatic discharge layer and arranged at the side surface of the first substrate and the side surface of the second substrate.

10. The organic light emitting display device of claim 9, further comprising:
    a metal frame on which the first substrate and the second substrate are mounted; and
    a conductive light-shielding portion arranged to cover the plurality of ground electrodes, the side surface of the first substrate and the side surface of the second substrate,
    wherein the conductive light-shielding portion is attached to an external sidewall of the metal frame and therefore the plurality of ground electrodes are electrically connected with the metal frame.

11. The organic light emitting display device of claim 10, wherein the conductive light-shielding portion includes a conductive adhesive layer attached to the outer sidewall of the metal frame and the plurality of ground electrodes, a metal film arranged on the conductive adhesive layer, and a light-shielding film arranged on the metal film, and is arranged to cover the flexible circuit film.

* * * * *